(12) United States Patent
Yin et al.

(10) Patent No.: US 10,840,408 B1
(45) Date of Patent: Nov. 17, 2020

(54) ENHANCED EFFICIENCY OF LED STRUCTURE WITH N-DOPED QUANTUM BARRIERS

(71) Applicant: VueReal Inc., Waterloo (CA)

(72) Inventors: Jian Yin, Waterloo (CA); Dayan Ban, Waterloo (CA); Ehsanollah Fathi, Waterloo (CA); Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 16/423,407

(22) Filed: May 28, 2019

(51) Int. Cl.
| | |
|---|---|
| *H01L 33/06* | (2010.01) |
| *H01L 33/02* | (2010.01) |
| *H01L 33/14* | (2010.01) |
| *H01L 33/00* | (2010.01) |
| *H01L 33/32* | (2010.01) |
| *H01L 33/30* | (2010.01) |

(52) U.S. Cl.
CPC ............ *H01L 33/06* (2013.01); *H01L 33/007* (2013.01); *H01L 33/0066* (2013.01); *H01L 33/025* (2013.01); *H01L 33/145* (2013.01); *H01L 33/30* (2013.01); *H01L 33/32* (2013.01)

(58) Field of Classification Search
CPC . H01L 33/0066; H01L 33/007; H01L 33/025; H01L 33/06; H01L 33/145; H01L 33/30; H01L 33/32
See application file for complete search history.

(56) References Cited

U.S. PATENT DOCUMENTS 9,166,098 B2 * 10/2015 Kang .................. H01L 33/06
2020/0212261 A1 * 7/2020 Lee ..................... H01L 33/06

* cited by examiner

*Primary Examiner* — Andrew Q Tran
(74) *Attorney, Agent, or Firm* — Nixon Peabody LLP

(57) ABSTRACT

The present invention provides light-emitting devices with improved quantum efficiency. The light emitting diode structure comprising: a p-doped layer, an n-doped layer; and a multiple quantum well structure sandwiched between the p-doped layer and n-doped layer, wherein the multiple quantum well structure comprising a quantum well disposed between n-doped barrier layers.

20 Claims, 8 Drawing Sheets

ENHANCED EFFICIENCY OF LED STRUCTURE WITH N-DOPED QUANTUM BARRIERS

FIELD OF THE INVENTION

This invention relates to light emitting diodes and more particularly to a microLED with improved quantum efficiency.

BACKGROUND OF THE INVENTION

As a solid-state lighting source with high luminance and a long lifetime, gallium nitride (GaN)/indium gallium nitride (InGaN) micro light emitting diodes (microLEDs) are considered a promising technology for many applications, including light sources for optogenetic neuron stimulation, micro-indicators, and self-emissive microdisplays.

The biggest problem restricting the efficiency performance of GaN/InGaN microLEDs is efficiency droop. This phenomenon can be mainly attributed due to factors such as auger recombination, low hole injection, and the carrier overflow theory. However, surface recombination factor, which causes carrier loss, can usually be ignored in GaN/InGaN LEDs.

However, when the size of the microLEDs shrinks down to a few micrometers, the surface recombination starts to dominate the efficiency performance of GaN/InGaN microLEDs. Almost the entire etching procedure can severely disrupt the crystal lattice and produce surface recombination trap defects. Recombination defects near the surface deplete the carriers in this region and draw carriers from the surrounding regions, causing lateral leakage current and drastic efficiency droop.

Thus, there is a need for an LED structure that can provide improved device efficiency performance.

SUMMARY OF THE INVENTION

The present invention provides microLED devices with improved quantum efficiency.

According to one embodiment, microLED structure includes n-doped barrier layers that provide improved internal quantum efficiency and reduced efficiency droop.

According to another embodiment, the microLED structure may comprises a single quantum well disposed between the n-doped barrier layers.

According to one embodiment, a light emitting diode structure may be provided. The light emitting diode structure may comprising a p-doped layer, an n-doped layer, and an active zone between the p-doped layer and n-doped layer, the active zone comprising a multiple quantum well structure, wherein the multiple quantum well structure comprising a quantum well disposed between n-doped barrier layers.

According to yet another embodiment, a light emitting diode structure may be provided. The light emitting diode structure may comprising a substrate, an n-doped layer deposited on the substrate, an active zone grown over the n-doped layer, the active zone comprising a multiple quantum well structure, wherein the multiple quantum well structure comprising a quantum well disposed between n-doped barrier layers, an electron blocking layer deposited on the active zone; and a p-doped layer deposited on the electron blocking layer.

According to some embodiments, an optimized design for $5 \times 5$ μm$^2$ microLEDs with n-doped barrier layers and a single quantum well shows an efficiency improvement of 128% at a current density of 20 A/cm$^2$ as compared to a conventional design with intrinsic multiple quantum well active regions.

According to one embodiment, the n-doped barrier layers flatten the conduction band and reduce the current leakage from n-GaN layer to p-GaN layers.

According to another embodiment, the Shockley-Read-Hall (SRH) recombination rate in a light-emitting device with n-doped barrier layers is much smaller than the SRH recombination rate in a light-emitting device with p-doped barrier layers. Thus, n-doped QW barriers performs better than devices with undoped or p-doped QW barriers in small dimensions (less than 10 um).

The foregoing and additional aspects and embodiments of the present disclosure will be apparent to those of ordinary skill in the art in view of the detailed description of various embodiments and/or aspects, which are made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Use of the same reference numbers in different figures indicates similar or identical elements.

Figure 1A:
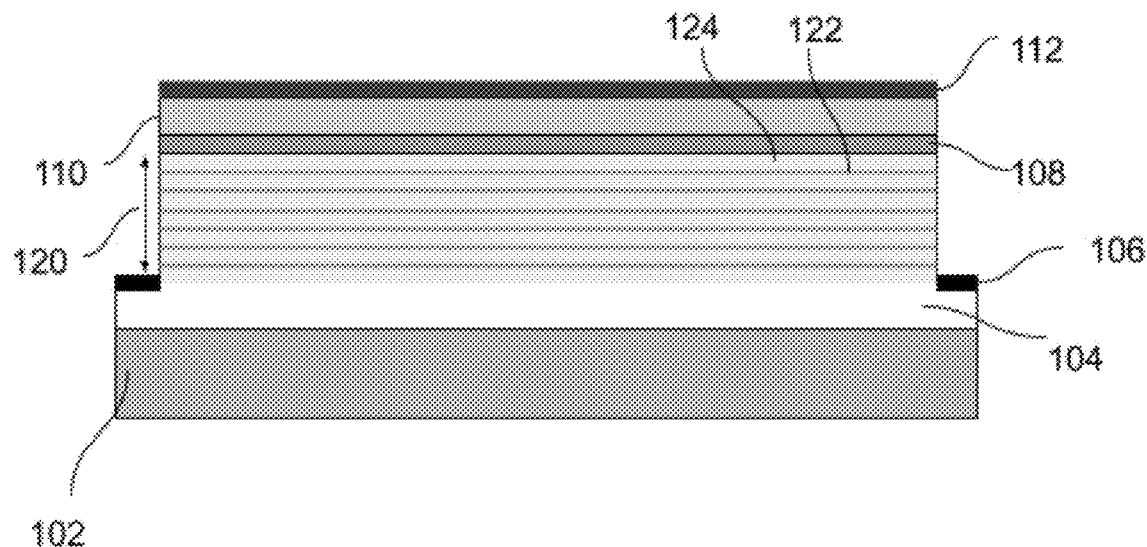
FIG. 1A shows a cross-sectional view of an LED structure having multiple quantum wells and p-doped barrier layers, in accordance with an embodiment of the invention.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure covers all modifications, equivalents, and alternatives falling within the spirit of the invention as defined by the appended claims.

DETAILED DESCRIPTION

Unless defined otherwise, all technical and scientific terms used herein have the same meaning as commonly understood by one of ordinary skill in the art to which this invention belongs.

As used in the specification and claims, the singular forms "a," "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate.

The terms "device" and "micro device" are used herein interchangeably. It would be clear to one skill in the art that the embodiments described here are independent of the device size.

In this disclosure, InGaN/GaN based LEDs are used as an example, However, the simulations result may applicable to other LED structures based on different material systems, such as GaAsP based LEDs, InGaAsP based LEDs, InGaAs based LEDs, or GaAs based LEDs.

The multiple quantum well structure may comprise quantum well and barrier layers. The quantum well may comprise one of: GaAs, InGaN, InGaAs, AlGaN and InGaAsP and the barrier layers may comprises one of: AlGaAs, GaN, AlGaAs, AlGaN and InP.

This disclosure provides a design of microLED structure using a single quantum well disposed between n-doped barrier layers to improve the efficiency performance, contrary to LEDs with regular sizes (i.e., greater than 100 μm) in which the barrier layers are typically p-doped to improve device efficiency performance.

According to one aspect of the invention, an optimized design for 5×5 μm² microLEDs with n-doped barrier layers and a single quantum well shows more than 100% efficiency improvement at a current density of 20 A/cm² compared to a conventional intrinsic multiple quantum well based design.

In conventional quantum well structures, a surface recombination velocity in GaN and InGaN is typically around $1\times10^2$ cm/s to $1\times10^5$ cm/s and the surface recombination area is around 1 μm from the semiconductor surface.

According to another aspect of the invention, Apsys software is employed to simulate GaN/InGaN based microLEDs by setting a surface recombination range of 1 μm and surface recombination velocity of $3\times10^4$ cm/s.

In one case, temperature-dependent measurements for the 50×50 μm² microLEDs are set to check the reliability of the simulation results.

Conventional p-i-n Structure with p-Doped Quantum Well Barrier Layers

FIG. 1A shows a cross-sectional view of a typical MQW heterostructure of an InGaN/GaN based LED. The heterostructure may comprise a growth substrate 102 (e.g., sapphire), an n-type GaN layer 104 formed on the substrate 102, a MQW structure 120 grown on the n-type GaN layer to generate radiation, an electron blocking layer 108, and a p-type GaN layer 110. The MQW structure 120 may comprise a plurality of alternating barrier layers 124 and quantum wells 122 (for example, six pairs of alternating quantum wells 122 sandwiched by barrier layers 124). In one example, the quantum wells 122 may comprise InGaN and the barrier layers 124 may comprise p-doped GaN.

The electron blocking layer 108 can be deposited on the MQW structure 120. In one case, the electron blocking layer may comprise p-type doped AlGaN. Then, a p-type GaN layer may be deposited on the p-type AlGaN. Further, a p-type metal contact 112 such as Pd/Au, Pt or Ni/Au is formed on the p-type GaN layer. Also, the substrate (e.g., sapphire) is an insulator, and the n-type GaN layer 104 is exposed to make contact to this layer. This step is usually done using a dry-etch process to expose the n-type GaN layer and then deposit the appropriate metal contacts (e.g., n-type metal contact 106).

The conventional p-doped barrier layers are well suited for GaN/InGaN LEDs with a regular size (>100 μm in dimension) to improve device efficiency performance.

However, when the size of microLEDs shrink down to a few micrometers (e.g., 5×5 μm²), the surface recombination starts to dominate the efficiency performance of GaN/InGaN p-doped barriers layers.

LED Structure with n-Doped Quantum Well Barrier Layers

Figure 1B:
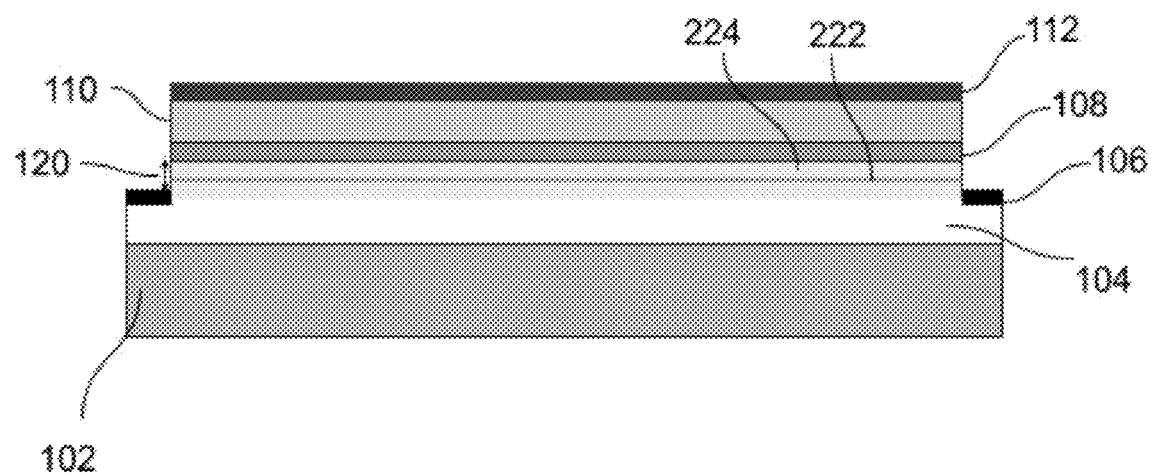
FIG. 1B shows a cross-sectional view of an LED structure having a single quantum well disposed between n-doped barrier layers, in accordance with an embodiment of the invention.

FIG. 1B shows cross-sectional view of an InGaN/GaN based LED with a single quantum well disposed between n-doped barrier layers, in accordance with an embodiment of the invention. The light-emitting device according to the present embodiment may comprise a growth substrate 102 (e.g., sapphire), an n-type GaN layer 104 formed on the substrate, a MQW active zone 120 grown on the n-type GaN layer to generate radiation, an electron blocking layer 108, and a p-type GaN layer 110.

Here, the MQW structure 120 may comprise a single quantum well 222 disposed between n-doped barrier layers 224. In one example, the quantum well 222 may comprise InGaN and the barrier layers 224 may comprise n-doped GaN. However, the simulations result may applicable to other LED structures based on different material systems, such as GaAsP based LEDs, InGaAsP based LEDs, InGaAs based LEDs, or GaAs based LEDs. The quantum well may comprise one of: GaAs, InGaN, InGaAs, AlGaN and InGaAsP and the barrier layers may comprises one of: AlGaAs, GaN, AlGaAs, AlGaN and InP.

According to one aspect of the invention, compared to the MQW structure shown in FIG. 1A, the single quantum well structure shown in FIG. 1B may reduce the ratio of surface area to volume, alleviate the surface recombination problems and significantly improve quantum efficiency.

Experimental and Simulation Results Analysis of GaN/InGaN Light-Emitting Diodes with p-Doped Barrier Layers Here, InGaN/GaN based LEDs are used as an example, However, the simulations result may applicable to other LEDs based on different material systems.

By setting the surface recombination range and the surface recombination velocity, the current-voltage curve and device quantum efficiency of a 50×50 μm² GaN/InGaN microLED were simulated at different temperatures, which are in good agreement with experimental results.

Simulations of the internal quantum efficiency of the LED structure of FIG. 1A are carried out with the Apsys software by setting the surface recombination velocity in GaN and InGaN to typically around $1\times10^2$ cm/s to $1\times10^5$ cm/s, the surface recombination velocity to $3\times10^4$ cm/s, and the surface recombination area to around 1 μm from the semiconductor surface as described below.

Figure 2A:
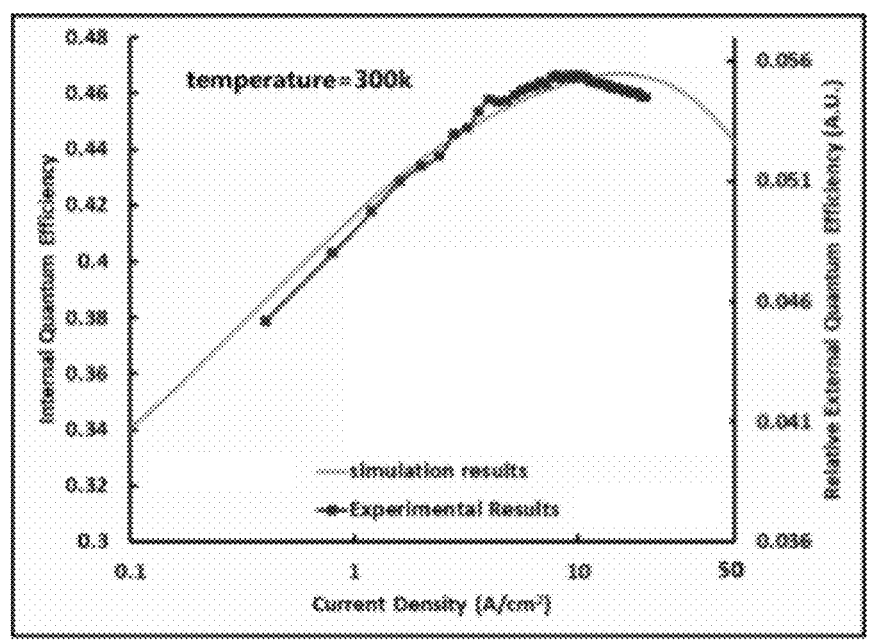
FIG. 2A is a graph of internal quantum efficiency (IQE) versus current density of an InGaN/GaN based LED, in accordance with an embodiment of the invention.

FIG. 2A is a graph of internal quantum efficiency (IQE) versus current density of a InGaN/GaN based LED, in accordance with an embodiment of the invention. The graph shows simulation and experimental results at a temperature of 300K on a log scale. Here, the LEDs are 50×50 μm² in size. In one case, the curve shows that the efficiency peak of the device shifts to a lower current density. The simulation results fit the experimental results well at room temperature. The differences shown between the simulation and experimental results because the microLEDs in simulation results cannot reflect the indium clustering issue in the quantum wells of actual (experimental) devices. The LEDs with nonuniform indium composition in quantum wells have a lower performance.

Figure 2B:
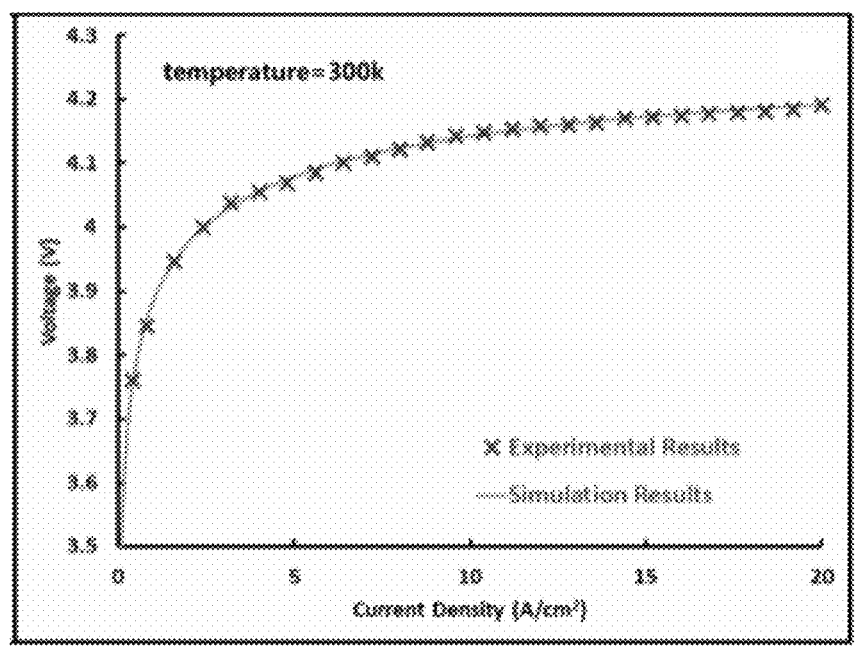
FIG. 2B depicts an I-V curve characterizing voltage versus current density of an InGaN/GaN based LED, in accordance with an embodiment of the invention.

FIG. 2B depicts an I-V curve characterizing voltage versus current density of an InGaN/GaN based LED on a log scale, in accordance with an embodiment of the invention. The current density range of experimental results is from 0.4 to 20 A/cm². As seen in the graph, with larger size (50×50 μm²), devices with p-doped barrier layers exhibit better performance in most of the common operation current density range (1 A/cm² to 50 A/cm²).

In one case, to verify the simulation, temperature-dependent measurement by experiment and simulation can be done.

Figure 3:
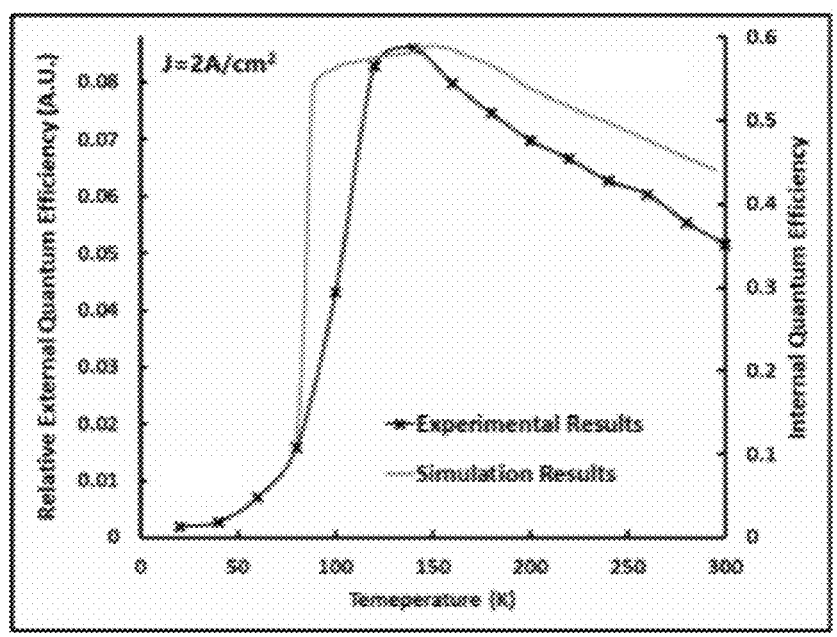
FIG. 3 is a graph of the measured relative external quantum efficiency (EQE) at different temperatures of an InGaN/GaN based LED, in accordance with an embodiment of the invention.

FIG. 3 is a graph of the measured relative external quantum efficiency (EQE) at different temperatures of an InGaN/GaN based LED, in accordance with an embodiment of the invention. The graph shows that the EQE almost doubles when the temperature decreases from 300K to 140K.

This increase in EQE occurs because low temperatures suppress the non-radiative recombination in the active region of the LED. However, when the temperature furtherly decreases below 120K, the EQE strongly decreases. The first reason for a decrease in efficiency at low temperatures is mainly due to the fluctuation in the quantum wells. The electroluminescence spectrum of InGaN/GaN LEDs first shifts to blue and then shifts to red between 300K to 5K. The energy peak position difference can be up to 40 meV. The imbalanced spatial distribution of indium (In) also reduces the density of radiative recombination centers in quantum wells. The quantum wells tend to cluster in a two to three nanometer region, with less radiative recombination centers in other regions. Some injected carriers overflow and reduce carrier injection efficiency, and even lower temperatures can aggravate this problem.

The second reason that InGaN/GaN-based LEDs exhibit poor performance in low temperature situations is the high activation energy or presence of Mg in GaN. Due to the high activation energy of the acceptors of GaN, the hole concentration dramatically decreases, and the recombination zone shifts from the active region to the p-type GaN region at low temperature, which leads to lower efficiency.

The differences between experimental and simulation results in FIG. 3 occur because the simulated LEDs cannot reflect the indium clustering issue in the quantum wells of actual devices. The nonuniform indium (In) spatial distribution leads the nonuniform radiative carrier lifetime $\tau_{rad}$, which averages the total $\tau_{rad}$ in quantum wells and smooths the curves. Therefore, the simulated temperature-dependent efficiency graph in FIG. 3 has a dramatic efficiency droop at around 90K, which is lower than the experimental one (around 120K) while the slope is larger.

Therefore, a more optimized LED design that can improve efficiency performance is needed.

Further, the simulation results can be discussed as follows. Theoretically, the internal quantum efficiency (IQE) of GaN/InGaN LEDs can be described by a simple model equation:

$$\eta_{IQE} = \frac{\eta_{inj} BN^2}{AN + BN^2 + CN^3} \quad (1)$$

where $\eta_{inj}$ is the injection current efficiency, N is the carrier density in quantum wells, and A, B, C, are the Shockley-Read-Hall (SRH) nonradiative recombination coefficient, the radiative coefficient, and the Auger coefficient, respectively. The peak efficiency $\eta_{peak}$ can be inferred when $d\eta_{IQE}/dN=0$, and the carrier density at peak efficiency can be obtained as $N_{peak}=\sqrt{AC}$ using equation (1).

For microLEDs that are just a few micrometers, the surface recombination overwhelms the auger recombination and dominates the nonradiative recombination. This means that the $N_{peak}$ shifts to a very high value and crosses the regular current operating range of an LED (i.e., greater than 100 A/cm²). This phenomenon illustrates that GaN/InGaN microLEDs with a smaller dimension no longer suffer from efficiency droop, but instead efficiency slowly rises with the injection current.

On the other hand, by neglecting the auger term, equation (1) with a low injection level can be simplified to:

$$\eta_{IQE} = \eta_{inj} \frac{1}{\frac{A}{BN}+1} \quad (2)$$

As seen in equation (2), increasing the carrier density N in quantum wells improves $\eta_{IQE}$. In one case, doping the barrier layers of an MQW active region can increase the carrier density in quantum wells. The additional electrons or holes compensate the carriers of the microLEDs for radiative recombination lost in current leakage due to nonradiative surface recombination.

Accordingly, p-doped barrier layers are commonly applied to alleviate the efficiency droop problem of GaN/InGaN LEDs caused by the low hole injection issues in GaN/InGaN LEDs.

Simulation and Experimental Analysis of GaN/InGaN Micro Light-Emitting Diodes with n-Doped Quantum Well Barriers FIGS. 4A-4D depict graphs comparing IQE against current density for GaN/InGaN LEDs with different dimensions and different doping profiles of barrier layers, in accordance with an embodiment of the invention.

Here, as an example, simulated IQE results of LEDs with different dimensions (i.e, 100×100 μm², 50×50 μm², 10×10 μm², and 5×5 μm²) and barrier layers with different doping profiles (i.e., intrinsic, p-doped at 1×10¹⁷ cm⁻³, and n-doped at 1×10¹⁷ cm⁻³) at room temperature are shown. These results show that the IQE value significantly deteriorates as the device size shrinks to 5×5 μm², and is strongly affected by the doping profile.

Figure 4A:
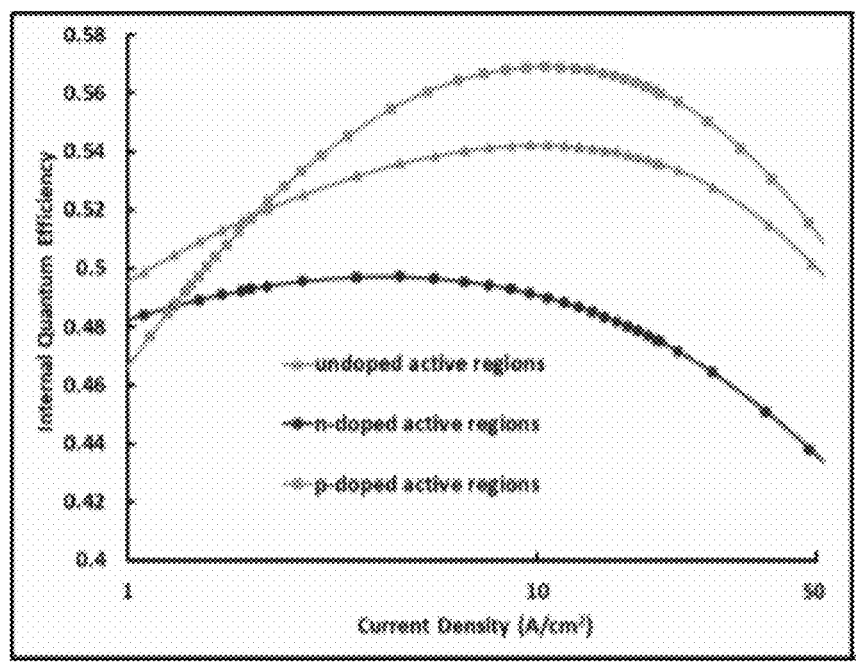
FIGS. 4A-4D depict graphs comparing IQE against current density for GaN/InGaN micro light-emitting diodes with different dimensions and different doping profiles of quantum well barriers, in accordance with an embodiment of the invention.

FIG. 4A shows a graph of IQE versus current density for 100×100 μm² GaN/InGaN LEDs. Here, the microLEDs have the dimensions 100×100 μm². The graph shows a comparison between different doping profiles of barrier layers. The doping profiles may comprise intrinsic active regions, p-doped active regions at 1×10¹⁷ cm⁻³, and n-doped active regions at 1×10¹⁷ cm⁻³. As seen from the graph, larger size (100×100 μm²) devices with p-doped barrier layers exhibit better performance in most of the common operation current density ranges (i.e., 1 A/cm² to 50 A/cm²) compared to intrinsic active regions and n-doped active regions.

Figure 4B:
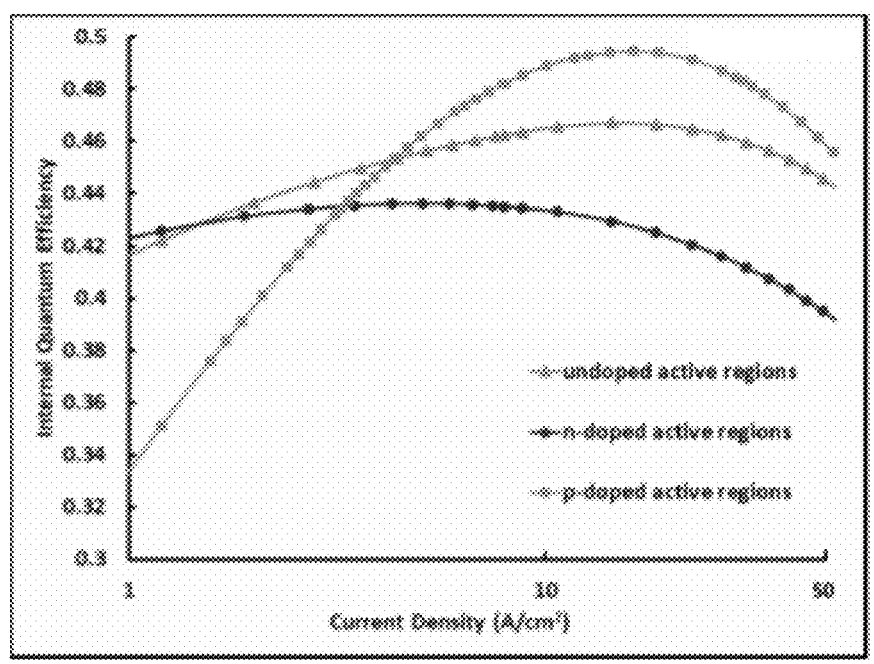

FIG. 4B shows a graph of IQE versus current density for a 50×50 μm² GaN/InGaN LED. The graph shows a comparison between different doping profiles of barrier layers. The doping profiles may comprise intrinsic active regions, p-doped active regions at 1×10¹⁷ cm⁻³, and n-doped active regions at 1×1×10¹⁷ cm⁻³. As seen from the graph, even when the device size shrinks to 50×50 μm², devices with p-doped barrier layers exhibit better performance in most of the common operation current density ranges (i.e., 1 A/cm² to 50 A/cm²) compared to intrinsic active regions and n-doped active regions.

Figure 4C:
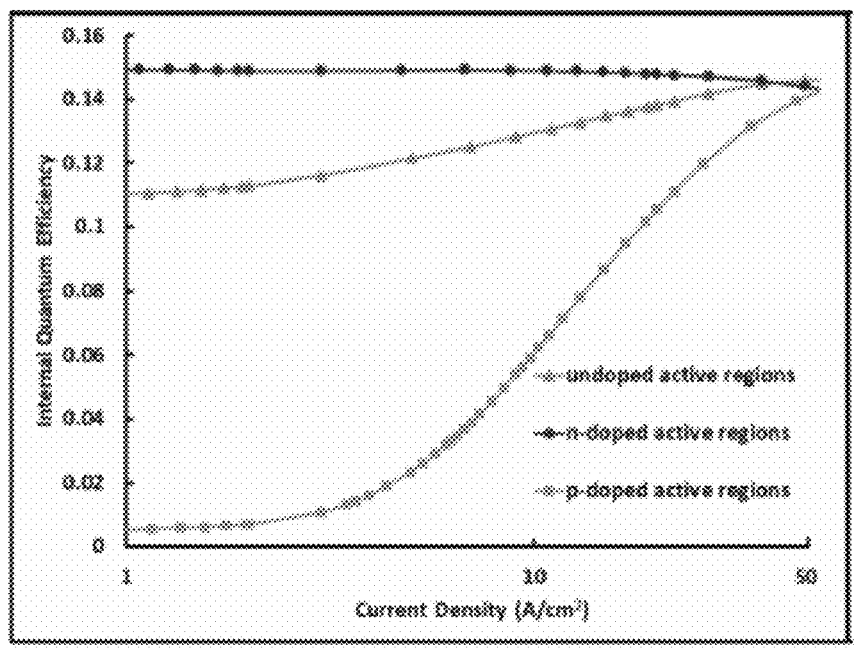

FIG. 4C shows a graph of IQE versus current density for 10×10 μm² GaN/InGaN microLEDs. The graph shows a comparison between different doping profiles of barrier layers. The doping profile may comprise intrinsic, p-doped at 1×10¹⁷ cm⁻³, and n-doped at 1×10¹⁷ cm⁻³. As seen from the graph, when the device size further shrinks to 10×10 μm², devices with n-doped barrier layers start performing better.

Here, the Shockley-Read-Hall (SRH) recombination mechanism can be analyzed. The SRH recombination rate is given through the SRH formula:

$$R_{SRH} = \frac{np - n_i^2}{\tau_p \frac{n}{f_n} + \tau_n \frac{p}{1 - f_p}} \quad (3)$$

where $\tau_{p,n}$ is the SRH lifetime and $f_{n,p}$ is the trap occupation probabilities.

With the same doping concentration, the SRH recombination rates at small injection levels in a GaN/InGaN LED with p-doped or n-doped barrier layers are:

$$R^n_{SRH} \equiv \frac{\Delta n p_0 f_n}{\tau_p (n_0 + \Delta n)} \quad (4)$$

$$R^p_{SRH} \equiv \frac{\Delta p n_0 (1 - f_p)}{\tau_n (p_0 + \Delta p)} \quad (5)$$

where the trap occupation probabilities $f_n$ in equation (4) and $1-f_p$ in equation (5) probably equal each other.

The proportional magnitude between $\tau_p$ and $\tau_n$ can be considered as the proportional magnitude between the hole and electron lifetime, $\tau_{p0}$ and $\tau_{n0}$, respectively. In GaN, $\tau_{p0}$ is much larger than $\tau_{n0}$. Therefore, the SRH recombination rate $R^n_{SRH}$ in a device with n-doped barrier layers is much smaller than the SRH recombination rate $R^p_{SRH}$ in a device with p-doped barrier layers.

Figure 4D:
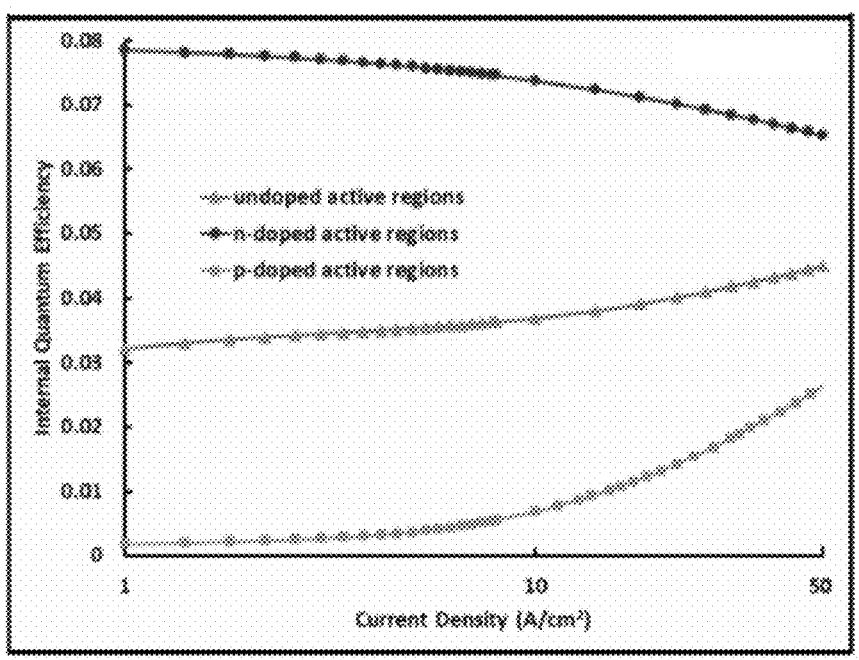

FIG. 4D shows a graph of IQE versus current density for 5×5 μm² GaN/InGaN microLEDs. The graph shows a comparison between different doping profiles of barrier layers. The doping profile may comprise intrinsic, p-doped at 1×10¹⁷ cm⁻³, and n-doped at 1×10¹⁷ cm⁻³. As seen from the graph, when the devices shrink to 5×5 μm², devices with n-doped barrier layers perform better than devices with undoped or p-doped barrier layers in small dimensions (i.e., less than 10 μm).

Although n-doped barrier layers can improve the efficiency of GaN/InGaN LEDs, n-doped barrier layers can aggravate the low hole injection problem and push the recombination zone close to the p-type GaN region.

Therefore, a very high doping concentration of n-doped barrier layers has a very strong efficiency droop problem and weakens the efficiency performance.

According to one aspect, revising the doping concentration in n-doped barrier layers shows the best performance of the simulated 5×5 μm² microLEDs by balancing the low holes injection and high nonradiative SRH recombination rate problems.

Figure 5:
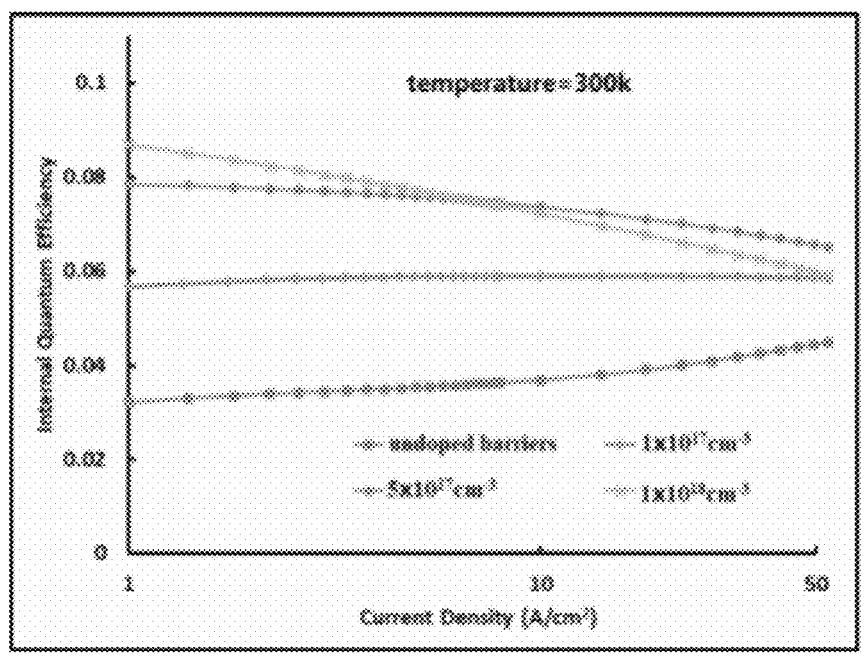
FIG. 5 is a graph comparing IQE against current density for InGaN/GaN micro light-emitting diodes with different doping concentrations of n-type quantum well barriers, in accordance with an embodiment of the invention.

FIG. 5 is a graph comparing IQE versus current density for GaN/InGaN microLEDs with different n-type doping concentrations of barrier layers, in accordance with an embodiment of the invention. Here, the microLEDs are 5×5 μm² and exhibit different efficiency curves based on different n-type doping concentrations. For example, the doping concentrations are 5×10¹⁷ cm⁻³, 1×10¹⁷ cm⁻³, and 1×10¹⁸ cm⁻³ as shown in the graph. Among six sets of n-doped barrier layers with different doping concentrations, the 5×10¹⁷ cm⁻³ n-doped quantum well barriers is the most optimized design.

Figure 6A:
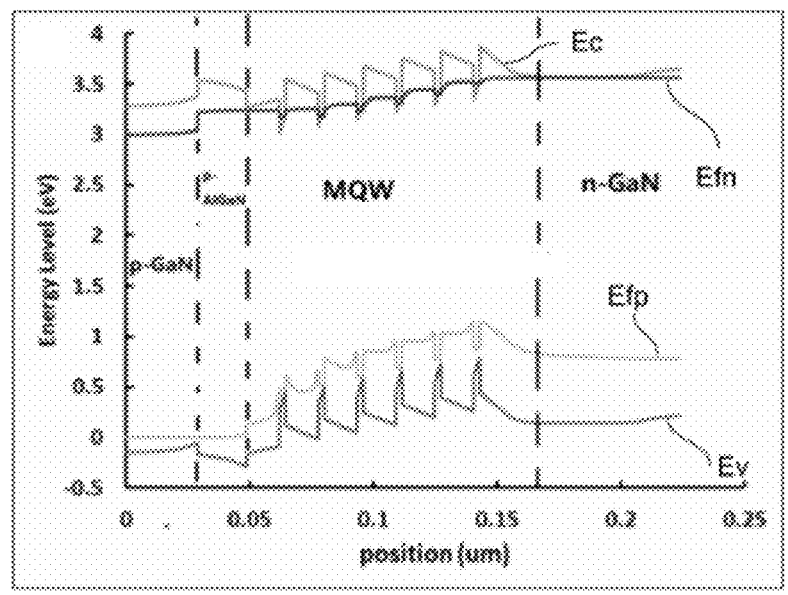
FIG. 6A is an energy band diagram of the p-doped barrier layers of the LED structure shown in FIG. 1A, in accordance with an embodiment of the invention.

FIG. 6A is an energy band diagram of the p-doped barrier layers of the InGaN/GaN based LED structure as shown in FIG. 1A. Theoretically, an LED emits energy corresponding to an energy gap of a conduction band and a valance band by combining electrons of an n layer and holes of a p layer upon applying a forward voltage.

The energy band diagram of the LED structure with p-doped barrier layers has been shown in FIG. 6A. As seen in the graph, the conductive band of MQW is not flat and there is current leakage from the n-GaN to p-GaN layers.

Figure 6B:
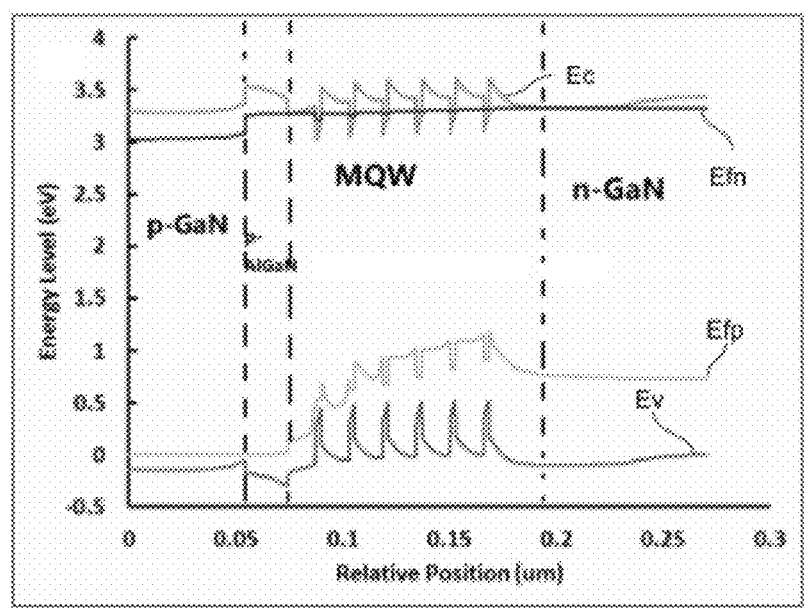
FIG. 6B is an energy band diagram of the n-doped barrier layers of the InGaN/GaN based LED structure shown in FIG. 1B, in accordance with an embodiment of the invention.

FIG. 6B is an energy band diagram of the n-doped barrier layers of the InGaN/GaN based LED structure shown in FIG. 1B. The energy band diagram of the LED structure is shown with n-doped barrier layers. As seen in the graph, n-doped barrier layers flatten the conductive band and reduce the current leakage from n-GaN to p-GaN layers.

From the energy band diagrams discussed above, the n-doped barrier layers surpasses the current leakage factor and improve efficiency performance.

Figure 7:
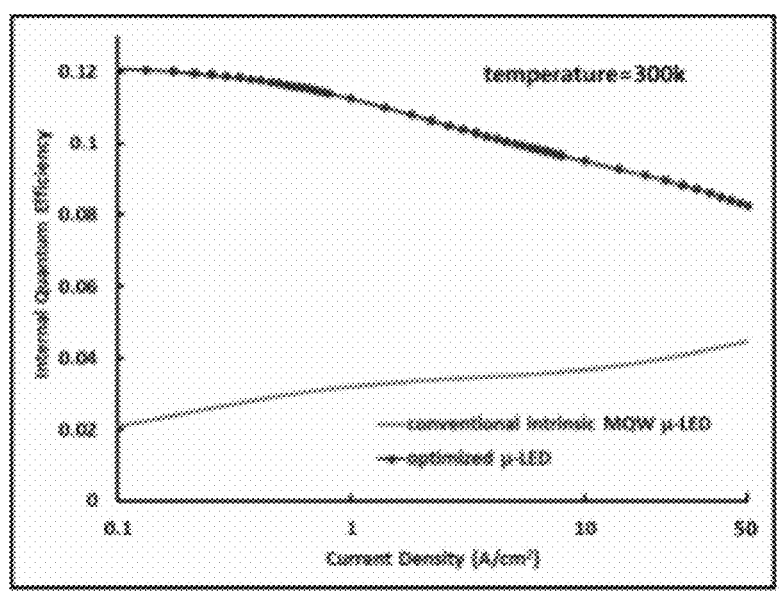
FIG. 7 is a graph comparing IQE against current density between an optimized microLED and a conventional microLED, in accordance with an embodiment of the invention.

FIG. 7 is a graph comparing IQE against current density between an optimized microLED and a conventional LED, in accordance with an embodiment of the invention. The graph shows an efficiency performance comparison of 5×5 μm² microLEDs with a single quantum well and n-doped barrier layers with a conventional LED structure. The conventional structure may have MQWs with intrinsic quantum well barrier layers. Compared to the MQW design, a single quantum well LED structure reduces the ratio of surface area to volume and alleviates the surface recombination problems. The graph reveals that the optimized LED design can achieve a 128% IQE improvement at 20 A/cm² compared to a conventional design with intrinsic MQW active regions.

According to one embodiment, a light emitting diode structure may be provided. The light emitting diode structure may comprising a p-doped layer, an n-doped layer, and an active zone between the p-doped layer and n-doped layer, the active zone comprising a multiple quantum well structure, wherein the multiple quantum well structure comprising a quantum well disposed between n-doped barrier layers.

According to another embodiment, the quantum well may comprise one of: GaAs. InGaN, InGaAs, AlGaN and InGaAsP and the barrier layers may comprises one of: AlGaAs, GaN, AlGaAs, AlGaN and InP. The n-doped barrier layers has a flat conduction band and reduced current leakage from n-doped layer to p doped layer.

According to yet another embodiment, each of the barrier layers may be doped with a dopant concentration ranging from undoped to $1\times10^{18}$ cm$^{-3}$ Each of the barrier layers may be doped with a dopant concentration of $5\times10^{17}$ cm$^{-3}$. The barrier layers may have a current density in a range of 0 to 50 A/cm$^2$. The barrier layers may have a current density of 20 A/cm$^2$.

According to some embodiments, the light emitting diode structure may further comprising: a substrate, wherein the n-type doped layer is deposited on the substrate and the multiple quantum well structure is grown over the n-type doped layer; and an electron blocking layer deposited on the multiple quantum well structure, wherein the p-type doped layer is deposited on the electron blocking layer.

According to one embodiment, the light emitting diode structure may further comprising: a p-type contact and an n-type contact deposited on the light emitting diode structure. The n-doped layer comprises an n-type GaN layer. The p-doped layer comprises a p-type GaN layer.

According to yet another embodiment, a light emitting diode structure may be provided. The light emitting diode structure may comprising a substrate, an n-doped layer deposited on the substrate, an active zone grown over the n-doped layer, the active zone comprising a multiple quantum well structure, wherein the multiple quantum well structure comprising a quantum well disposed between n-doped barrier layers, an electron blocking layer deposited on the active zone; and a p-doped layer deposited on the electron blocking layer.

According to some embodiments, the multiple quantum well structure comprises one of: GaAs/AlGaAs, InG InaN/GaN, InGaAs/AlGaAs, AlGaN/AlGaN and InGaAsP/InP.

According to one embodiment, a method of manufacturing a light emitting diode structure may be provided. The method may comprising providing a substrate, forming an n-doped layer on the substrate; and forming a multiple quantum well structure over the n-doped layer, wherein the multiple quantum well structure comprising a quantum well disposed between n-doped barrier layers.

According to another embodiment, the method may further comprising forming an electron blocking layer on the multiple quantum well structure; and forming a p-type doped layer on the electron blocking layer.

According to yet another embodiment, the substrate may comprises a sapphire substrate. Each of the barrier layers may be doped with a dopant concentration ranging from undoped to 1×1018 cm–3. each of the barrier layers may be doped with a dopant concentration of 5×1017 cm–3. The barrier layers may have a current density in a range of 0 to 50 A/cm2. The barrier layers may have a current density of 20 A/cm2.

In summary, an optimized design for 5×5 μm$^2$ microLEDs with n-doped barrier layers and a single quantum well shows an efficiency improvement of 128% at a current density of 20 A/cm$^2$ as compared to a conventional design with intrinsic MQW active regions.

The foregoing description of one or more embodiments of the invention has been presented for illustration and description purposes. It is not intended to be exhaustive or to limit the invention to the precise form disclosed. Many modifications and variations are possible in light of the teaching herein. The scope of the invention is not intended to be limited by this detailed description, but rather by the appended claims.

The invention claimed is:

1. A light emitting diode structure comprising:
   a p-doped layer;
   an n-doped layer; and
   a multiple quantum well structure sandwiched between the p-doped layer and n-doped layer, the multiple quantum well structure comprising:
      a quantum well disposed between n-doped barrier layers.

2. The light emitting diode structure of claim 1, wherein the quantum well comprises one of: GaAs, InGaN, InGaAs, AlGaN and InGaAsP.

3. The light emitting diode structure of claim 1, wherein the barrier layers comprise one of: AlGaAs, GaN, AlGaAs, AlGaN and InP.

4. The light emitting diode structure of claim 1, wherein the n-doped barrier layers have a flat conduction band and reduced current leakage from n-doped layer to p-doped layer.

5. The light emitting diode structure of claim 1, wherein each of the barrier layers is doped with a dopant concentration ranging from undoped to $1\times10^{18}$ cm$^{-3}$.

6. The light emitting diode structure of claim 5, wherein each of the barrier layers is doped with a dopant concentration of $5\times10^{17}$ cm$^{-3}$.

7. The light emitting diode structure of claim 1, wherein the barrier layers have a current density in a range of 0 to 50 A/cm.

8. The light emitting diode structure of claim 7, wherein the barrier layers have a current density of 20 A/cm$^2$.

9. The light emitting diode structure of claim 1, further comprising:
   a substrate, wherein the n-type doped layer is deposited on the substrate and the multiple quantum well structure is grown over the n-type doped layer; and
   an electron blocking layer deposited on the multiple quantum well structure, wherein the p-type doped layer is deposited on the electron blocking layer.

10. The light emitting diode structure of claim 1, further comprising:
    a p-type contact and an n-type contact deposited on the light emitting diode structure.

11. The light emitting diode structure of claim 1, wherein the n-doped layer comprises an n-type GaN layer.

12. The light emitting diode structure of claim 1, wherein the p-doped layer comprises a p-type GaN layer.

13. A light emitting diode structure comprising:
    a substrate;
    an n-doped layer deposited on the substrate;
    a multiple quantum well structure formed over the n-doped layer, wherein the multiple quantum well structure comprising a quantum well disposed between n-doped barrier layers;
    an electron blocking layer deposited on the multiple quantum well structure; and
    a p-doped layer deposited on the electron blocking layer.

14. The light emitting diode structure of claim 13, wherein the quantum well comprises one of: GaAs, InGaN, InGaAs, AlGaN and InGaAsP.

15. The light emitting diode structure of claim 13, wherein the barrier layers comprise one of: AlGaAs, GaN, AlGaAs, AlGaN and InP.

16. A method of manufacturing a light emitting diode structure, the method comprising:
    providing a substrate;
    forming an n-doped layer on the substrate; and
    forming a multiple quantum well structure over the n-doped layer, wherein the multiple quantum well structure comprising a quantum well disposed between n-doped barrier layers.

17. The method of claim 16, further comprising
forming an electron blocking layer on the multiple quantum well structure; and
forming a p-type doped layer on the electron blocking layer.

18. The method of claim 16, wherein the substrate comprises a sapphire substrate.

19. The method of claim 16, wherein each of the barrier layers is doped with a dopant concentration ranging from undoped to $1\times10^{18}$ cm$^{-3}$.

20. The method of claim 16, wherein the barrier layers have a current density in a range of 0 to 50 A/cm$^2$.

* * * * *